United States Patent
Jeong et al.

(10) Patent No.: US 11,925,124 B2
(45) Date of Patent: Mar. 5, 2024

(54) INSERTION LAYERS FOR PERPENDICULARLY MAGNETIZED HEUSLER LAYERS WITH REDUCED MAGNETIC DAMPING

(71) Applicants: Samsung Electronics Co., Ltd., Gyeonggi-do (KR); INTERNATIONAL BUSINESS MACHINES CORPORATION, Armonk, NY (US)

(72) Inventors: Jaewoo Jeong, San Jose, CA (US); Panagiotis Charilaos Filippou, San Jose, CA (US); Yari Ferrante, San Jose, CA (US); Chirag Garg, San Jose, CA (US); Mahesh Samant, San Jose, CA (US); Ikhtiar, San Jose, CA (US); Dmytro Apalkov, San Jose, CA (US)

(73) Assignee: Samsung Electronics Co., Ltd., Yongin-si (KR)

( * ) Notice: Subject to any disclaimer, the term of this patent is extended or adjusted under 35 U.S.C. 154(b) by 289 days.

(21) Appl. No.: 17/217,766

(22) Filed: Mar. 30, 2021

(65) Prior Publication Data
US 2022/0223783 A1    Jul. 14, 2022

Related U.S. Application Data

(60) Provisional application No. 63/136,570, filed on Jan. 12, 2021.

(51) Int. Cl.
*H10N 50/80* (2023.01)
*G11C 11/16* (2006.01)
(Continued)

(52) U.S. Cl.
CPC .......... *H10N 50/80* (2023.02); *G11C 11/161* (2013.01); *H01F 10/1936* (2013.01);
(Continued)

(58) Field of Classification Search
None
See application file for complete search history.

(56) References Cited

U.S. PATENT DOCUMENTS 9,042,057 B1    5/2015    Diao
9,966,529 B1    5/2018    Iwata
(Continued)

OTHER PUBLICATIONS

EPO Extended Search Report dated Feb. 9, 2022, for corresponding European Patent Application No. 21203638.8 (11 pages).

*Primary Examiner* — Kevin M Bernatz
(74) *Attorney, Agent, or Firm* — Lewis Roca Rothgerber Christie LLP

(57) ABSTRACT

A magnetic structure, a magnetic device incorporating the magnetic structure and a method for providing the magnetic structure are described. The magnetic structure includes a magnetic layer, a templating structure and a resistive insertion layer. The magnetic layer includes a Heusler compound and has a perpendicular magnetic anisotropy energy exceeding an out-of-plane demagnetization energy. The templating structure has a crystal structure configured to template at least one of the Heusler compound and the resistive insertion layer. The magnetic layer is on the templating structure. The (Continued)

resistive insertion layer is configured to reduce magnetic damping for the Heusler compound and allow for templating of the Heusler compound.

11 Claims, 7 Drawing Sheets

(51) Int. Cl.
    *H01F 10/193*    (2006.01)
    *H01F 10/30*     (2006.01)
    *H01F 10/32*     (2006.01)
    *H10B 61/00*     (2023.01)
    *H10N 50/01*     (2023.01)
    *H10N 50/10*     (2023.01)
    *H10N 50/85*     (2023.01)

(52) U.S. Cl.
    CPC ............ *H01F 10/30* (2013.01); *H10B 61/00* (2023.02); *H10N 50/01* (2023.02); *H10N 50/10* (2023.02); *H10N 50/85* (2023.02); *H01F 10/3254* (2013.01); *H01F 10/3268* (2013.01)

(56) References Cited

U.S. PATENT DOCUMENTS

| | | | |
|---|---|---|---|
| 10,839,833 B1* | 11/2020 | Freitag | H01F 10/3286 |
| 2007/0176251 A1 | 8/2007 | Oh | |
| 2011/0007560 A1 | 1/2011 | Dieny | |
| 2015/0129993 A1* | 5/2015 | Tang | H10N 50/01 |
| | | | 257/421 |
| 2015/0129996 A1* | 5/2015 | Tang | H10N 50/85 |
| | | | 257/427 |
| 2015/0162378 A1* | 6/2015 | Carey | H10N 50/85 |
| | | | 257/421 |
| 2017/0330668 A1* | 11/2017 | Takahashi | H01F 10/3286 |
| 2018/0294003 A1* | 10/2018 | Gao | G11C 11/161 |
| 2018/0366172 A1 | 12/2018 | Wang | |
| 2019/0035849 A1 | 1/2019 | Jeong et al. | |
| 2020/0013429 A1* | 1/2020 | Freitag | G11B 5/3909 |
| 2020/0279993 A1 | 9/2020 | Iwata | |
| 2022/0013714 A1* | 1/2022 | Park | H10B 61/20 |
| 2022/0165939 A1* | 5/2022 | Jeong | H01F 10/30 |
| 2022/0262555 A1* | 8/2022 | Jeong | H01F 10/20 |
| 2023/0025589 A1* | 1/2023 | Inubushi | H10N 50/85 |

* cited by examiner

INSERTION LAYERS FOR PERPENDICULARLY MAGNETIZED HEUSLER LAYERS WITH REDUCED MAGNETIC DAMPING

CROSS REFERENCE TO OTHER APPLICATIONS

This application claims priority to U.S. Provisional Patent Application No. 63/136,570 entitled INSERTION LAYERS FOR PERPENDICULARLY MAGNETIZED HEUSLER FREE LAYER WITH LOW MAGNETIC DAMPING filed Jan. 12, 2021 which is incorporated herein by reference for all purposes.

BACKGROUND OF THE INVENTION

Magnetic memories such as magnetic random access memories (MRAMs) store information utilizing magnetic materials as an information storage medium. For example, a magnetic tunneling junction (MTJ) may be used in an MRAM, such as a spin transfer torque MRAM (STT-MRAM). The MTJ typically includes a reference layer, a free layer and a tunneling barrier layer between the reference and free layers. The reference and free layers are magnetic. The magnetic moment of the reference layer is generally fixed, or pinned, in a particular direction. The free layer has a changeable magnetic moment and is used to store information. A bottom contact below the MTJ and a top contact on the MTJ are used to drive current through the MTJ in a current-perpendicular-to-plane (CPP) direction in an STT-MRAM. In case of MTJs with positive tunnel magnetoresistance (TMR), when a sufficient current is driven in one direction perpendicular-to-plane (e.g. top to bottom), the free layer magnetic moment switches to be parallel to that of the reference layer. When a sufficient current is driven in the opposite direction (e.g. bottom to top), the free layer magnetic moment switches to be antiparallel to that of the reference layer. Different magnetic configurations correspond to different magnetoresistances and thus different logical states (e.g. a logical "0" and a logical "1") of the MTJ.

Because of their potential for use in a variety of applications, research in magnetic memories is ongoing. Accordingly, what is needed is a method and system that may improve the performance of magnetic junctions.

BRIEF DESCRIPTION OF THE DRAWINGS

Various embodiments of the invention are disclosed in the following detailed description and the accompanying drawings.

DETAILED DESCRIPTION

Figure 1A:
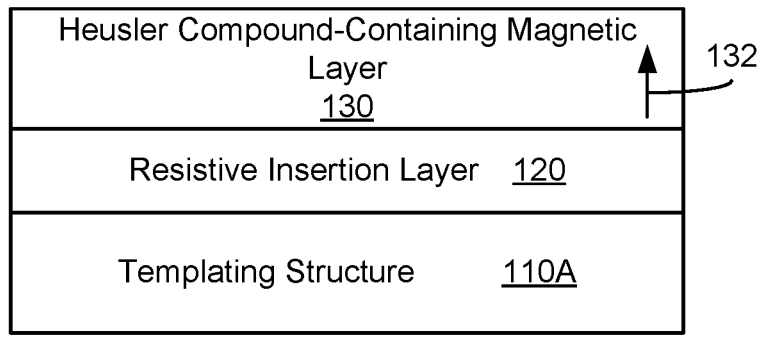
FIGS. 1A-1C depicts embodiments of magnetic structures including Heusler compounds and having reduced magnetic damping.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

The exemplary embodiments are described in the context of particular methods, layers, devices, magnetic junctions and magnetic memories having certain components. One of ordinary skill in the art will readily recognize that the present invention is consistent with the use of devices, magnetic junctions and magnetic memories having other and/or additional components and/or other features not inconsistent with the present invention. The method and system are also described in the context of current understanding of various physical phenomena. Consequently, one of ordinary skill in the art will readily recognize that theoretical explanations of the behavior of the method and system are made based upon this current understanding of these physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic and/or like structures. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction. The method and system are also described in the context of certain alloys. Unless otherwise specified, if specific concentrations of the alloy are not mentioned, any stoichiometry not inconsistent with the method and system may be used.

Magnetic tunneling junctions (MTJs) may be used in memories such as magnetic random access memories (MRAMs). MTJs may be programmable by a current driven in a current-perpendicular-to-plane (CPP) direction and used in a spin-transfer torque MRAM (STT-MRAM). Some MTJs utilize tunnel barriers formed from MgO as well as free and reference layers that include alloys of Co, Fe and B (termed "CoFeB" herein, without requiring a specific stoichiometry). The magnetic moments of the free and reference layers may be desired to be oriented perpendicular to the layer ("perpendicular-to-plane"). For magnetic layers having a perpendicular-to-plane magnetic moment, the perpendicular magnetic anisotropy (PMA) energy of the magnetic layer exceeds the out-of-plane demagnetization energy. However, the PMA of such a CoFeB layer arises from the interfaces between the CoFeB layer and the tunneling barrier layer and/or the underlayer on which the CoFeB layer is deposited. However, this means that such CoFeB layers may not be thermally stable if the device size is reduced to below approximately twenty nanometers in size. As such, Co—Fe—B layers may be unsuitable for use in more dense memory applications.

Magnetic materials that have a PMA arising from a volume effect and which may have a perpendicular-to-plane magnetic moment at small thicknesses include Heusler compounds. Heusler compounds may have the chemical formula $X_2YZ$ or $X'X'''YZ$; where X, X', X", and Y may be transition metals or lanthanides (rare earth metals) and Z may be from a main group metal. Heusler compounds can have a structure of the type $Cu_2MnAl$ in which the elements are disposed on four interpenetrating face-centered cubic (fcc) lattices. Heusler compounds form a structure defined by the space group symmetry $L2_1$ (or $D0_{22}$ when they are tetragonally distorted). The properties of Heusler compounds are strongly dependent on the chemical ordering of the elements constituting the compounds. Many Heusler compounds are known to have a structure of the type $Cu_2MnAl$. Some of these Heusler compounds are ferromagnetic or ferrimagnetic due to magnetic moments on the X and/or Y sites. Some parent Heusler compounds are cubic and exhibit weak or no significant magnetic anisotropy. However, the structure of some magnetic Heusler compounds is tetragonally distorted. Such a tetragonal Heusler compound has a crystal structure that is tetragonal instead of cubic. A tetragonal Heusler compound may also be magnetic. Due to the tetragonal distortion the magnetization exhibited by these compounds may be preferably aligned along the tetragonal axis. Thin films formed from such materials may exhibit PMA due to a magneto-crystalline anisotropy associated with their tetragonally distorted structure. For example, such tetragonal Heusler compounds include $Mn_3Z$ where Z=Ga, Ge, Sn, and Sb. Some such tetragonal Heusler compounds may be grown at smaller thicknesses and maintain their PMA. For example, with underlayers such as $Mn_xN$ (where x is generally within range of 2 to 4.5) and CoAl (usually nominally 1:1 composition ratio), some tetragonal Mn-containing Heusler compounds possessing PMA may be grown with smaller thicknesses. Similarly, magnetic $L1_0$ compounds containing Mn may be grown at smaller thicknesses. Such magnetic $L1_0$ compounds include MnSb alloys, MnAl alloys, MnSn alloys and MnGa alloys. Similarly tetragonal C38 phase of Mn containing compounds such as MnAlGe, MnGaGe, MnAlGa, MnGeIn, and MnGaSn, etc. which are ferromagnetic and low moment can also be used as free layer within MTJ device.

In addition to a large PMA, magnetic layers are also desired to have a low magnetic moment. A low magnetic moment allows for a lower switching current and a narrow switching pulse width (e.g. twenty nanoseconds and/or less). Heusler compounds may fulfill these criteria. For example, Heusler compounds grown on certain metallic underlayers, such as CoAl (e.g. B2 CoAl formed from alternating layers of Co and Al) may have a large PMA and a low magnetic moment. However, magnetic junctions employing such Heusler compounds may have a higher magnetic damping than desired. For example, in some cases, such Heusler compounds may have a magnetic damping on the order of that found in CoFeB. A high magnetic damping increases the switching current, which is undesirable. Consequently, a mechanism for decreasing the switching current of magnetic junctions while maintaining their PMA is desirable.

A magnetic structure, a magnetic device incorporating the magnetic structure and a method for providing the magnetic structure are described. The magnetic structure includes a magnetic layer, a templating structure and a resistive insertion layer. The magnetic layer includes a Heusler compound and has a perpendicular magnetic anisotropy energy exceeding an out-of-plane demagnetization energy. The templating structure has a crystal structure configured to template the resistive insertion layer and/or the Heusler compound. The magnetic layer is on the templating structure. The resistive insertion layer is configured to reduce magnetic damping for the Heusler compound and allow for templating of the Heusler compound.

In some embodiments, the resistive insertion layer has a location selected from a first location, a second location, and a third location. The first location is between the templating structure and the magnetic layer. The second location is such that the templating structure is between the resistive insertion layer and the magnetic layer. The third location is on the magnetic layer such that the magnetic layer is between the templating structure and the resistive interlayer.

For the resistive insertion layer being at the first location, the resistive interlayer has a lattice mismatch of not more than ten percent for the Heusler compound. Thus, the resistive insertion layer at the first location is crystalline. For the resistive insertion layer having the first location, the resistive insertion layer may also have a (001) texture and a thickness of not more than 2 nanometers. In such embodiments, the Heusler compound may have a Heusler thickness of at least five nanometers. In such embodiments, the templating layer is configured to template at least the resistive insertion layer.

For the resistive insertion layer being at the second location, the resistive interlayer has not more than ten percent lattice mismatch with the Heusler compound. Thus, the resistive insertion layer at the second location is crystalline. The templating structure may have a thickness of not more than twenty Angstroms. In some such embodiments, the templating structure has a lattice mismatch with the Heusler compound of not more than ten percent and is configured to template the Heusler compound. In some embodiments, the templating structure has a thickness of at least one Angstrom and not more than twenty Angstroms. In some such embodiments, the templating structure has a thickness of not more than ten Angstroms. The thickness of the templating structure may be not more than five Angstroms. In some embodiments, the magnetic structure includes an additional templating structure. The resistive insertion layer is between the templating structure and the additional templating structure. The additional templating structure may be on and in physical contact with the $Mn_xN$-containing layer-seed layer.

For the resistive insertion layer having the third location, the magnetic structure may also include a tunneling barrier layer. The templating structure is on the tunneling barrier layer and the resistive interlayer is further from a substrate than the magnetic layer. The templating structure is magnetic and may have the thickness of not more than twenty Angstroms. In some embodiments, the templating structure includes $Co_{(1-x)}Al_x$, where x is less than 0.4. In such embodiments, the templating structure is configured to template the Heusler compound. In some such embodiments, the thickness of the templating structure is not more than ten Angstroms. In some embodiments, a $Mn_xN$-containing layer (e.g. a seed layer) is included.

A magnetic device is also described. The magnetic device may include the magnetic structure. For example, the magnetic device may include a free layer, a nonmagnetic spacer layer, a reference layer, a resistive insertion layer and a templating structure. The nonmagnetic spacer layer is between the free and reference layers. The free layer, templating structure and resistive insertion layer may be analogous to the magnetic layer, templating structure and resistive insertion layer of the magnetic structure. Thus, the free layer includes a Heusler compound and has a perpendicular magnetic anisotropy energy exceeding an out-of-plane demagnetization energy. The templating structure and resistive insertion layer are analogous to those described for the magnetic structure. Thus, the templating structure has a crystal structure configured to template the Heusler compound and/or the resistive insertion layer. The free layer is on the templating structure. The resistive insertion layer is configured to reduce magnetic damping for the Heusler compound and allow for templating of the Heusler compound. For example, in some embodiments, the Heusler compound includes at least one of $Mn_3Ge$, $Mn_3Al$, $Mn_3Sb$, $Mn_3Ga$, $Mn_3Sn$, $Mn_3In$, and $Mn_2CoSn$. The resistive insertion layer may include at least one of MgO, Mg—Al-Oxide, Mg—Ti-Oxide, Mg—Fe-Oxide, Mg—Zn-Oxide, Mg—Mn-Oxide, $MgAl_2O_4$, $CaTiO_3$, $SrTiO_3$, $BaTiO_3$, $LaAlO_3$, $BaSnO_3$, NaCl, LiF, GaAs, ZnSe, $Cu(In_xGa_{1-x})Se_2$, AlN and ScN. The templating structure may include at least one of Ta, Ru, Fe, Ir, CoFeB, MgO, Ta—N, Ti—N, Mn—N, VN, Cu—N, Sc—N, CoSn, CoGe, NiAl, FeAl, CoAl, RuAl, IrAl, Cr, CuZn, AgZn, Ag—Mg, and Cr—Ru.

The resistive insertion layer has a location selected from a first location, a second location, and a third location analogous to the first, second and third locations for the magnetic structure. For the resistive insertion layer at the first location, the resistive interlayer has a lattice mismatch of not more than ten percent for the Heusler compound. In such embodiments, the templating layer is configured to template at least the resistive insertion layer. In some such embodiments, the nonmagnetic spacer layer has a nonmagnetic spacer layer resistance, the resistive insertion layer has a (001) texture and a resistance of not more than twenty percent of the nonmagnetic spacer layer resistance. In some such embodiments, the resistive insertion layer has a resistance of not more than ten percent of the nonmagnetic spacer layer resistance. The Heusler compound may also have a Heusler thickness of at least five nanometers in such embodiments.

For the second location, the resistive interlayer may have a lattice mismatch and the templating structure has a thickness of not more than twenty Angstroms. Thus, the resistive insertion layer is crystalline. In some such embodiments, the templating structure is at least one Angstrom and not more than ten Angstroms thick. In some embodiments, the thickness of the templating structure is not more than five Angstroms. The templating structure is also configured to template the Heusler compound. The magnetic device may also include an additional templating structure. The resistive insertion layer is between the templating structure and the additional templating structure. In such embodiments, the additional templating structure is thicker than the templating structure. The magnetic device may also include a seed layer on which the additional templating structure resides and shares an interface with. For example, the seed layer may include $Mn_xN$, where x is at least 2 and not more than 4.75. In some such embodiments, x is at least 2 and not more than 4.

For the third location, the resistive interlayer is further from a substrate than the free layer. In some such embodiments, the nonmagnetic spacer layer is a tunneling barrier layer and the templating structure is on the tunneling barrier layer. In such embodiments, the templating structure may be magnetic and is configured to template the Heusler compound. The templating structure may have the thickness of not more than twenty Angstroms. In some embodiments, the templating structure includes $Co_{(1-x)}Al_x$, where x is less than 0.4 and the thickness is not more than ten Angstroms. The resistive insertion layer may be amorphous. For example, the amorphous resistive insertion layer may include one or more of amorphous Al-Oxide, Al-rich Mg—Al-Oxide, Ga-Oxide, Mg—Ga-Oxide, In—Zn-Oxide, and In-Ga—Zn-Oxide.

A method for providing a magnetic structure and/or magnetic device is also described. The method includes providing a templating structure having a crystal structure configured to template at least one of a resistive insertion layer and a Heusler compound. The method also includes providing, on the templating structure, a magnetic layer including the Heusler compound. The magnetic layer has a perpendicular magnetic anisotropy energy exceeding an out-of-plane demagnetization energy. A resistive insertion layer configured to reduce magnetic damping for the Heusler compound and allow for templating of the Heusler compound is also provided. In some embodiments, the method includes providing the resistive insertion layer at the first, second, and/or third location described above. For the resistive insertion layer being at the first location, the resistive interlayer has a lattice mismatch of not more than ten percent for the Heusler compound. For the resistive insertion layer being at the second location, the resistive interlayer may have a lattice mismatch and the templating structure has a thickness of not more than twenty Angstroms. For the resistive insertion layer being at the third location, the resistive interlayer is further from a substrate than the magnetic layer.

Figure 1B:
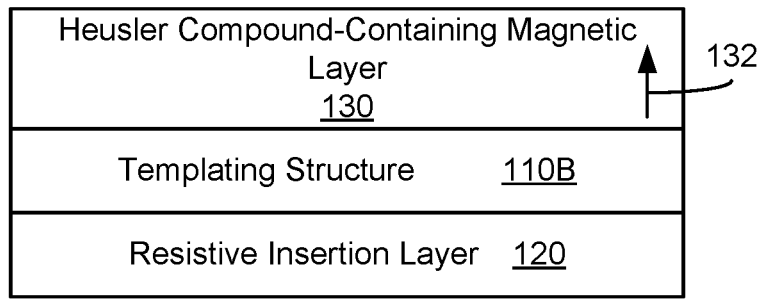
Figure 1C:
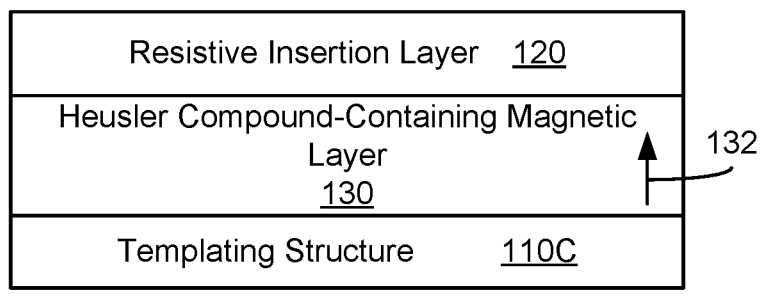

FIGS. 1A-1C depicts embodiments of magnetic structures 100A, 100B, and 100C including Heusler compounds and having reduced magnetic damping. FIGS. 1A-1C are not to scale and additional layers (not shown) may be present in some embodiments. The magnetic structure 100A, 100B and/or 100C may be used in a variety of magnetic devices and, therefore, a variety of electronic devices. For example, the magnetic structure may be used in a magnetic junction such as a magnetic tunneling junction (MTJ) that may be included in a magnetic random access memory (MRAM).

Referring to FIG. 1A, magnetic structure 100A includes templating structure 110A, resistive insertion layer 120, and magnetic layer 130. Magnetic layer 130 includes a Heusler compound having a high perpendicular magnetic anisotropy (PMA). In some embodiments, magnetic layer 130 includes only Heusler compound(s). For example, magnetic layer 130 may be a layer consisting of a Heusler compound. In other embodiments, magnetic layer 130 may be a multilayer including one or more Heusler compounds and/or other materials. Magnetic layer 130, and the Heusler compound(s) therein, each has a PMA energy that exceeds the out-of-plane demagnetization energy. Thus, magnetic moment 132 of magnetic layer 130 has stable states perpendicular to plane. One such stable state is shown in FIG. 1A. In some embodiments, magnetic layer 130 includes or consists of particular Mn-based Heusler compounds. For example, the Heusler compound(s) used may include or be composed of one or more of $Mn_3Ge$, $Mn_3Al$, $Mn_3Sb$, $Mn_3Ga$, $Mn_3Sn$, $Mn_3In$, and/or $Mn_2CoSn$. Although these Heusler alloys are most likely to be stable in tetragonal phase ($D0_{22}$), the formation of a distorted cubic phase having a high PMA is still possible if resistive insertion layer 120 has an in-plane lattice constant significantly larger than that of the magnetic layer 130. This situation may occur for resistive insertion layer 120 including rock-salt oxide(s). In some embodiments, other high PMA Heusler compounds may be used. The Heusler compound, and thus magnetic layer 130, are sufficiently thick that any issues due to the lattice mismatch with resistive insertion layer 120 may be resolved. For example, the Heusler compound of magnetic layer 130 may be at least five nanometers thick. In some embodiments, the Heusler compound of magnetic layer is at least one nanometer thick, but may be less than five nanometers thick. In some such embodiments, the Heusler compound is at least two nanometers thick. Other thicknesses may be possible.

Templating structure 110A is used to template resistive insertion layer 120. Because resistive insertion layer 120 is used to template magnetic layer 130, templating structure 110A may also be considered to template the Heusler compound of magnetic layer 130. Thus, templating structure 110A is configured to have the appropriate structure (e.g. lattice constant, symmetry and/or texture) for growing or otherwise providing one or more layers on templating structure 110A. For example, templating structure 130 may have a (001) texture and a small lattice mismatch (e.g. not more than ten percent in some embodiments and not more than five percent in some such embodiments) with resistive insertion layer 120. This allows resistive insertion layer 120 to be provided such that resistive insertion layer 120 can template the desired structure of the Heusler compound(s) of magnetic layer 130. Templating structure 110A is a single layer in some embodiments. In other embodiments, templating structure 110A is a multilayer. Materials for templating structure 110A may include or consist of one or more of Ta, Ru, Fe, Ir, CoFeB, MgO, Ta—N, Ti—N, Mn—N, VN, Cu—N, Sc—N, CoSn, CoGe, NiAl, FeAl, CoAl (including B2 CoAl having alternating layers of Co and Al), RuAl, IrAl, Cr, and Cr—Ru. In some embodiments, templating structure 110A is at least five Angstroms thick and not more than six hundred Angstroms thick. In some embodiments, templating structure 110A is not more than three hundred Angstroms thick. In some such embodiments, templating structure 110A may be not more than ten Angstroms thick. In some embodiments, templating structure 110A may reside on and be in physical contact with (e.g. share an interface with) a seed layer (not shown) such as a $Mn_xN$ seed layer (e.g. where x is at least 2 or 2.5 and not more than 4 or 4.75). In some embodiments, such a seed layer may be at least five nanometers and not more than thirty nanometers thick.

Resistive insertion layer 120 is configured to reduce magnetic damping for the Heusler compound and allow for templating of the Heusler compound. Resistive insertion layer 120 may be a single layer in some embodiments. Other structures may be possible. Resistive insertion layer 120 is adjacent to magnetic layer 130. In the embodiment shown, resistive insertion layer 120 shares an interface with magnetic layer 130. Resistive insertion layer 120 may thus share an interface with the Heusler compound of magnetic layer 130.

Thus, resistive insertion layer 120 is configured to have the appropriate structure (e.g. lattice constant, symmetry and/or texture) for growing or otherwise providing the Heusler compound(s) of magnetic layer 130 residing on resistive insertion layer 120. Stated differently, resistive insertion layer 120 is configured to template the Heusler compound(s) of magnetic layer 130. To template of the Heusler compound (e.g. provide the appropriate lattice constant, symmetry and/or orientation for growing the Heusler compound(s) having the desired structure), resistive insertion layer 120 may include one or more insulating and/or semiconducting compounds that have small in-plane lattice mismatch with the Heusler compound(s) of magnetic layer 130. Thus, resistive insertion layer 120 is crystalline. In some embodiments, the lattice mismatch between the Heusler compound of magnetic layer 130 and resistive interlayer is not more than ten percent (e.g. the in-plane lattice constant of resistive insertion layer 120 is within ten percent of the in-plane lattice constant for the Heusler compound of magnetic layer 130). In some embodiments, the lattice mismatch between the Heusler compound of magnetic layer 130 and resistive insertion layer 120 is not more than eight percent. In some embodiments, the lattice mismatch between the Heusler compound of magnetic layer 130 and resistive insertion layer 120 is not more than five percent. Further, the symmetry of resistive insertion layer 120 sufficiently matches the desired symmetry of the Heusler compound(s) in magnetic layer 130. The symmetry of resistive insertion layer 120 may be cubic for a Heusler compound having cubic symmetry. For example, resistive insertion layer 120 may be a cubic oxide, a cubic nitride, and/or a cubic semiconductor. Thus, the Heusler compound of magnetic layer 130 having a (001) orientation and the desired crystal structure may be provided on resistive insertion layer 120. In some embodiments, resistive insertion layer 120 includes one or more of rock-salt oxides such as MgO, Mg—Al-Oxide, Mg—Ti-Oxide, Mg—Fe-Oxide, Mg—Zn-Oxide, and Mg—Mn-Oxide; spinel oxides such as $MgAl_2O_4$; perovskite oxides that may have the form $ABO_3$, where A and B are cations of different sizes, such as $CaTiO_3$, $SrTiO_3$, $BaTiO_3$, $LaAlO_3$, $BaSnO_3$; and halides such as NaCl and LiF; non-oxides (e.g. semiconductors) such as GaAs, ZnSe, and $Cu(In_xGa_{(1-x)})Se_2$, and resistive nitrides such as AlN and ScN Although it is a resistive layer, the total resistance of resistive insertion layer 120 is desired to have a small effect on operation of a device employing magnetic structure 100A. Thus, the resistance of resistive insertion layer 120 is desired to be relatively small in comparison to other layer(s) of a device incorporating magnetic structure 100A. For example, in magnetic tunneling junctions (MTJs) in which magnetic structure 100A is incorporated, the resistance of resistive insertion layer 120 may be not more than twenty percent of the tunneling barrier resistance. In some such embodiments, the resistance of resistive insertion layer 120 is not more than ten percent of the tunneling barrier resistance. In some embodiments, the resistance of resistive insertion layer 120 may be not more than five percent of the tunneling barrier resistance. In some such embodiments, the resistance of resistive insertion layer 120 may be not more than two percent of the tunneling barrier resistance. The resistance area product of resistive insertion layer 120 is thus smaller than the resistance area product of the tunneling barrier layer. Consequently, the parasitic resistance due to resistive insertion layer 120 may be reduced. For similar reasons, resistive insertion layer 120 may be not more than 2 nanometers thick in some embodiments. In some embodiments, resistive insertion layer 120 is not more than 1 nanometer thick.

In the absence of resistive insertion layer 120, magnetic layer 130 may have a high magnetic damping. For example, in spin transfer torque (STT) programming, a spin polarized current is driven through magnetic layer 130 to switch the state of magnetic moment 132. Electrons in the spin polarized current transfer their angular momentum to magnetic layer 130, causing magnetic moment 132 to switch directions to its other stable state (e.g. toward the bottom of the page in FIG. 1A). However, absent resistive insertion layer 120, electrons from magnetic layer 130 may readily travel to templating structure 110A. These electrons share their (polarized) angular momentum with the nonmagnetic templating structure 110A. Magnetic damping occurs. As a result, the current required to switch magnetic moment 132 between stable states (e.g. the direction shown in FIG. 1A and one hundred and eighty degrees from this direction) using STT is greater than desired. Further, longer current pulses may be required in such a case.

The presence of resistive insertion layer 120 may reduce magnetic damping. Resistive insertion layer 120 may reduce the movement of electrons between magnetic layer 130 and templating structure 110A. In the STT programming example above, a spin polarized current is still driven through magnetic layer 130. Electrons in the spin polarized current still transfer their angular moment to magnetic layer 130. However, the relatively higher resistance of resistive insertion layer 120 reduces or precludes the movement of electrons from magnetic layer 130 to templating structure 110A and/or other conductive structures. Thus, magnetic damping may be reduced. Magnetic layer 130 may be written using a smaller magnitude write current and/or a shorter current pulse width. Thus, performance of a device incorporating magnetic structure 100A may be improved.

Referring to FIG. 1B, magnetic structure 100B includes templating structure 110B, resistive insertion layer 120, and magnetic layer 130. Templating structure 110B, resistive insertion layer 120 and magnetic layer 130 of magnetic structure 100B are analogous to Templating structure 110A, resistive insertion layer 120 and magnetic layer 130, respectively, of magnetic structure 100A depicted in FIG. 1A. However, templating structure 110B is between resistive insertion layer 120 and magnetic layer 130. Thus, templating structure 110B is used to template magnetic layer 130. In some embodiments, the composition and structure of templating structure 110B may differ from that of templating structure 110A.

Magnetic layer 130 of magnetic structure 100B depicted in FIG. 1B is analogous to magnetic layer 130 of magnetic structure 100A. Thus, magnetic layer 130 includes or consists of a Heusler compound having a high PMA and magnetic moment 132 that is stable perpendicular to plane. In some embodiments, magnetic layer 130 includes only Heusler compound(s). Because templating structure 110B may share an interface with magnetic layer 130, and thus may share an interface with the Heusler compound contained therein, magnetic layer 130 may be better templated to the desired structure. Therefore, the Heusler compound(s) of magnetic layer 130 may be thinner. For example, the Heusler compound(s) (and thus magnetic layer 130) may be less than five nanometers thick. In some embodiments, the Heusler compound(s) may be at least two nanometers thick and not more than five nanometers thick. In some embodiments, the Heusler compound(s) are not more than two nanometers thick and at least one nanometer thick in some embodiments. Other thicknesses may be possible.

Templating structure 110B is used to template the Heusler compound(s) of magnetic layer 130. Templating structure 110B may, therefore, share an interface with magnetic layer 130 and the Heusler compound(s) therein. Further, templating structure 110B has a structure (e.g. lattice constant, symmetry, and/or orientation) that promote growth of the Heusler compound(s) for magnetic layer 130. Templating structure 110B may have analogous structure, properties, and composition as for at least some embodiments of templating structure 110A. For example, templating layer 110B may include or be composed of any one or more of B2 binary alloys such as CoAl, CoGa, CoGe, CoSn, NiAl, FeAl, IrAl, RuAl, CuZn, and AgZn and/or other cubic-based ordered alloys (e.g. Ag—Mg) having a small (e.g. not more than ten percent and not more than five percent in some embodiments) in-plane lattice mismatch with the Heusler compound of magnetic layer 130. In some embodiments, templating structure 110B has a small lattice mismatch with resistive insertion layer 120 on which templating structure 110B is situated. Templating structure 110B may be significantly thinner in magnetic structure 100B than templating structure 110A of magnetic structure 100A. In some embodiments, templating structure 110B of magnetic structure 100B is not more than twenty Angstroms thick. For example, templating structure 110B of magnetic structure 100B may be at least five Angstroms and not more than twenty Angstroms. In some such embodiments, templating structure 110B of magnetic structure 100B may be not more than ten Angstroms at least five Angstroms. Templating structure 110B of magnetic structure 100B may be not more than ten Angstroms at least one Angstrom. In some embodiments, templating structure 110B is at least one Angstrom and not more than five Angstroms.

Resistive insertion layer 120 is configured to reduce magnetic damping for the Heusler compound and allow for templating of the Heusler compound and templating structure 110B. Resistive insertion layer 120 of magnetic structure 100B is analogous to resistive insertion layer 120 of magnetic structure 100A. Thus, the structure and materials used for resistive insertion layer 120 of magnetic structure 100B are analogous to that of resistive insertion layer 120 of magnetic structure 100A. For example, resistive insertion layer 120 may include of MgO, Mg—Al-Oxide, Mg—Ti-Oxide, Mg—Fe-Oxide, Mg—Zn-Oxide, Mg—Mn-Oxide, $MgAl_2O_4$, $CaTiO_3$, $SrTiO_3$, $BaTiO_3$, $LaAlO_3$, $BaSnO_3$, NaCl, LiF, GaAs, ZnSe, and/or $Cu(In_xGa_{1-x})Se_2$. The total resistance of resistive insertion layer 120 is desired to have a small effect on operation of a device employing magnetic structure 100B. Thus, the resistance and/or resistance-area product of resistive insertion layer 120 of magnetic structure 100B is analogous to that of resistive insertion layer 120 of magnetic structure 100A.

In some embodiments, resistive insertion layer 120 resides on an additional templating structure (not shown) that is analogous to templating structure 110B but may be thicker. In such cases, resistive insertion layer 120 may be viewed as being within a thicker templating structure. Such an additional templating layer may provide templating (e.g. (001) texture) for resistive insertion layer 120. The additional templating layer may also provide templating for templating layer 110B and/or magnetic layer 130. For example, such an additional templating layer may include Ta, Ru, Fe, Ir, CoFeB, MgO, Ta—N, Ti—N, Mn—N, VN, Cu—N, ScN, IrAl, CoGe, CoSn, NiAl, FeAl, CoAl, RuAl, Cr, and Cr—Ru. Magnetic layer 130 may, therefore, grow with a (001) orientation. An additional seed layer (not shown) may underlie and share an interface with the additional templating structure. For example, the seed layer (not shown) may be a $Mn_xN$ seed layer (e.g. where x is at least 2 or 2.5 and not more than 4 or 4.75).

The presence of resistive insertion layer 120 in magnetic structure 100B may reduce magnetic damping. Resistive insertion layer 120 may reduce the movement of electrons between magnetic layer 130 and layers under resistive insertion layer 120. Although electrons may still move between magnetic layer 130 and templating structure 110B of magnetic structure 100B, templating structure 110B is thin. Consequently, the amount of angular momentum imparted to templating structure 110B may be significantly reduced. Magnetic damping may thus be reduced. Consequently, magnetic layer 130 may be written using a smaller magnitude write current and/or a shorter current pulse width. Thus, performance of a device incorporating magnetic structure 100B may be improved.

FIG. 1C depicts magnetic structure 100C. Magnetic structure 100C includes templating structure 110C, resistive insertion layer 120, and magnetic layer 130. Templating structure 110C, resistive insertion layer 120 and magnetic layer 130 of magnetic structure 100C are analogous to those of magnetic structure(s) 100A and/or 100B. However, magnetic layer 130 is between templating structure 110C and resistive insertion layer 120.

Magnetic layer 130 of magnetic structure 100C depicted in FIG. 1C is analogous to magnetic layer 130 of magnetic structure(s) 100A and/or 100B. Thus, magnetic layer 130 includes or consists of one or more Heusler compounds having a high PMA. Magnetic layer 130 also has magnetic moment 132 that is stable perpendicular to plane. Because templating structure 110C may share an interface with magnetic layer 130, and thus may share an interface with the Heusler compound contained therein, magnetic layer 130 may be better templated to the desired structure. Therefore, the Heusler compound of magnetic layer 130 may be thinner. For example, the Heusler compound may be less than five nanometers thick. In some embodiments, the Heusler compound may be at least two nanometers thick. In some embodiments, the Heusler compound is not more than two nanometers thick. The Heusler compound is at least one nanometer thick in some embodiments. Other thicknesses may be possible.

Templating structure 110C is used to template the Heusler compound(s) of magnetic layer 130 and may share an interface with magnetic layer 130 and the Heusler compound(s) therein. However, in some embodiments, templating structure 110C might be omitted. When magnetic structure 100C is used in connection with a top free layer MTJ, magnetic layer 130 may be the free layer. In such embodiments, templating structure 110C resides on the tunneling barrier layer or other nonmagnetic spacer layer. In such embodiments, templating structure 110C may not only be thin, but also magnetic. In some embodiments, templating structure 110C is not more than twenty Angstroms thick. For example, templating structure 110C of magnetic structure 100C may be at least five Angstroms and not more than twenty Angstroms. In some such embodiments, the templating structure 110C of magnetic structure 100C may be not more than ten Angstroms. In some embodiments, templating structure 110C is at least one Angstrom and not more than five Angstroms. Templating structure 110C of magnetic structure 100C may be not more than ten Angstroms at least one Angstrom thick.

Templating structure 110C of magnetic structure 100C may also be magnetic. Use of a magnetic templating structure 110C may help preserve the magnetoresistance for the MTJ incorporating magnetic structure 100C. However, templating structure 110C is still desired to template the Heusler compound(s) of magnetic layer 130. Thus, the crystal structure (e.g. in-plane lattice constant, symmetry and/or texture) of templating structure 110C is desired to be analogous to those described above, particularly templating structure 110B. For example, templating structure 110C may include or consist of $Co_{(1-x)}Al_x$, where x is less than 0.4. Such an alloy is magnetic and may have the desired crystal structure for promoting growth of magnetic layer 130.

Resistive insertion layer 120 of magnetic structure 100C is configured to reduce magnetic damping and is analogous to resistive insertion layer(s) 120 of magnetic structure(s) 100A and/or 100B. Thus, the structure and materials used for resistive insertion layer 120 of magnetic structure 100C are analogous to that of resistive insertion layer(s) 120 of magnetic structure(s) 100A and/or 100B. However, in some embodiments, resistive insertion layer 120 may be amorphous. This is because templating of magnetic layer 130 may be achieved by templating structure 110C. Thus, the materials used for resistive insertion layer 120 of magnetic structure 100C may also include any amorphous compounds that are semiconducting or insulating in nature. For example, Al-Oxide, Al-rich Mg—Al-Oxide, Ga-Oxide, Mg—Ga-Oxide, In—Zn-Oxide, and/or In-Ga—Zn-Oxide may be used. The total resistance of resistive insertion layer 120 is still desired to have a small effect on operation of a device employing magnetic structure 100C. Thus, the resistance and/or resistance-area product of resistive insertion layer 120 of magnetic structure 100C is analogous to that of resistive insertion layer(s) 120 of magnetic structure(s) 100A and/or 100B.

The presence of resistive insertion layer 120 in magnetic structure 100C may reduce magnetic damping. Insertion layer 120 may reduce the movement of electrons between magnetic layer 130 and overlying layers. Magnetic damping may also be reduced. Consequently, magnetic layer 130 may be written using a smaller magnitude write current and/or a shorter current pulse width. Thus, performance of a device incorporating magnetic structure 100C may be improved.

As discussed above, magnetic structure(s) 100A, 100B and/or 100C may be incorporated in magnetic devices, such as magnetic junctions and magnetic memories using the magnetic junctions. Examples of such magnetic junctions are depicted in FIGS. 2A-2C and 3A-3B.

Figure 2A:
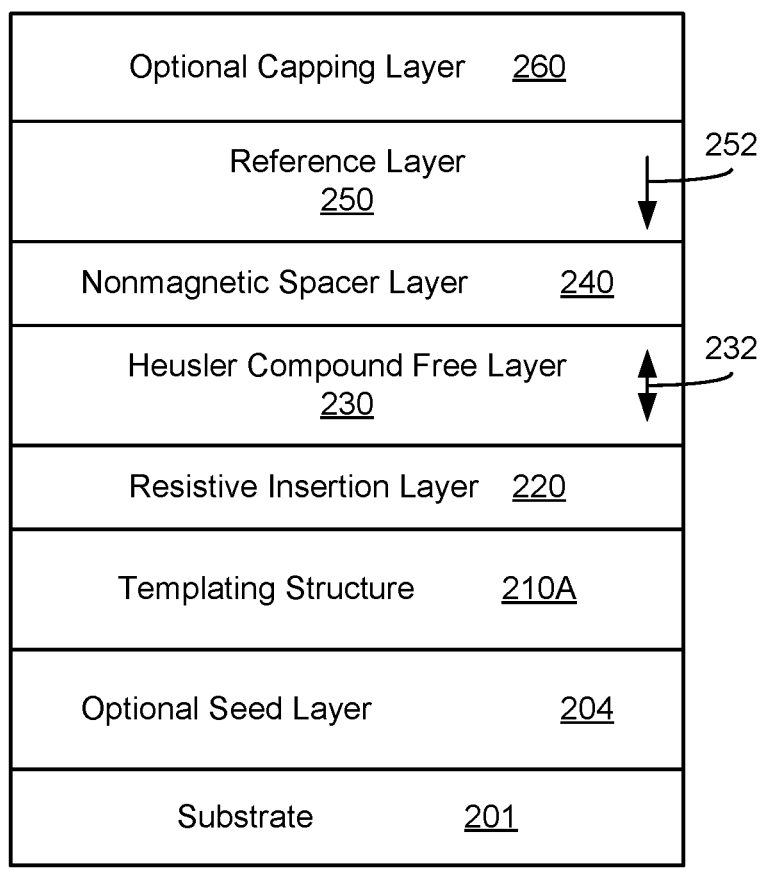
FIGS. 2A-2C depict embodiments of magnetic junctions including Heusler compounds and having reduced magnetic damping.
Figure 2B:
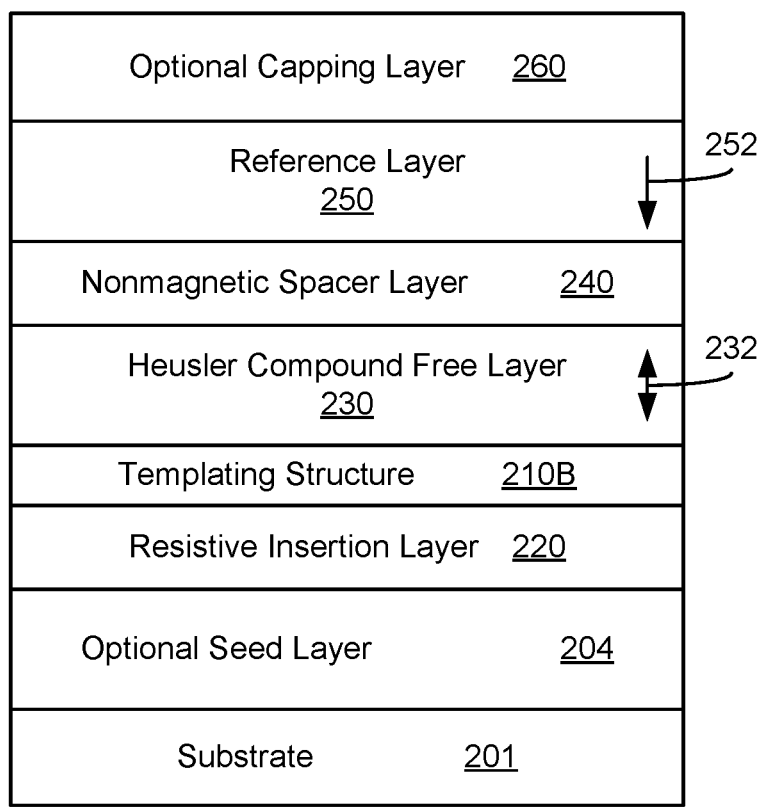
Figure 2C:
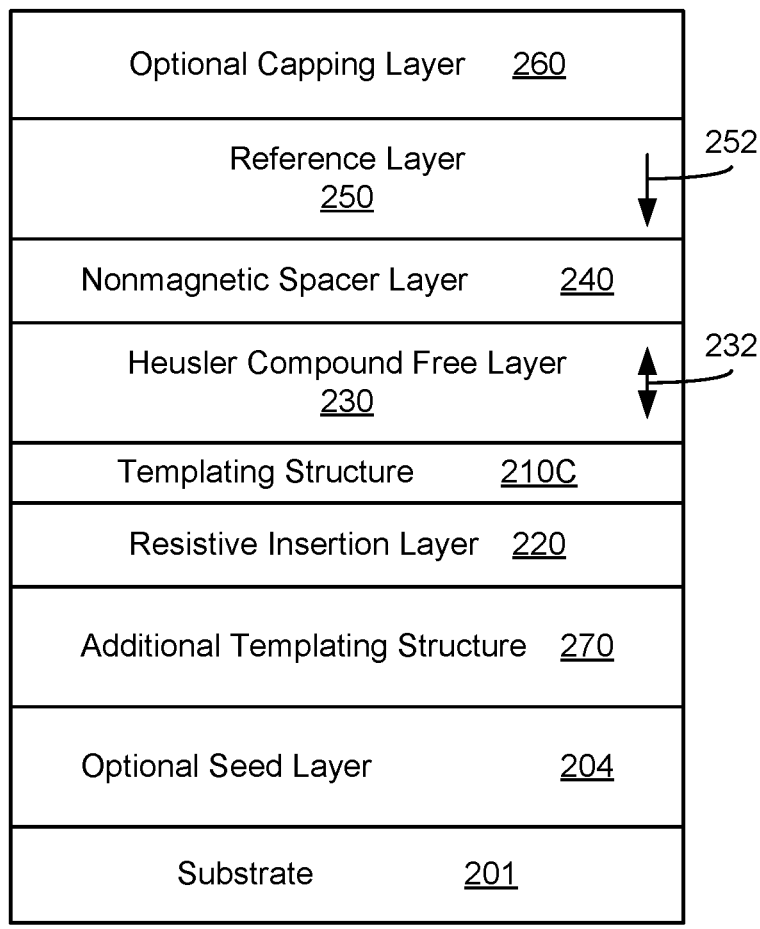

FIGS. 2A-2C depict embodiments of magnetic devices 200A, 200B and 200C including Heusler compounds and having reduced magnetic damping. For clarity, FIGS. 2A-2C are not to scale. In the embodiments shown, magnetic devices 200A, 200B, and 200C are bottom free layer magnetic junctions. Thus, the free layer is closer to the substrate than the reference layer in such magnetic junctions. Magnetic devices 200A, 200B and/or 200C may be used in a variety of electronic devices, such as MRAMs. Although particular layers are shown, other and/or different structures may be included.

FIG. 2A depicts magnetic junction 200A residing on substrate 201. Magnetic junction 200A includes templating structure 210A, resistive insertion layer 220, free layer 230, nonmagnetic spacer layer 240, and reference layer 250. Reference layer 250 and free layer 230 are magnetic, having magnetic moments 252 and 232, respectively. In the embodiment shown, each of free layer 230 and reference layer 250 have a PMA anisotropy energy that exceeds the out-of-plane demagnetization energy. Consequently, magnetic moments 232 and 252 are shown as perpendicular to plane. Magnetic moment 232 of free layer 230 may be programmed to be in one of multiple stable states. Consequently, magnetic moment 232 is shown as dual headed arrow. Magnetic moment 252 of reference layer 250 is stable in the embodiment shown. Consequently, magnetic moment 252 is shown as a single arrow. Although shown in a particular direction (toward the bottom of the page), magnetic moment 252 may be stable in another direction (e.g. toward the top of the page). Magnetic junction 200A may also include optional polarization enhancement layer(s) (PEL(s)) having a high spin polarization. For example, a PEL might include Fe, CoFe and/or CoFeB. The PEL may be between reference layer 250 and nonmagnetic spacer layer 240 and/or between nonmagnetic spacer layer 240 and free layer 230. Also shown are optional seed layer(s) 204 and optional capping layer(s) 260. Capping layer 260 may include or be composed of any one or a combination of Ta, Ru, Mo, W, CoFeB, Pt, and metallic nitrides (e.g. Ta—N, Ti—N, Mo—N etc.). Seed layer 204 includes seed layer(s) used for providing templating structure 210A. For example, seed layer 204 may include a Ta layer on substrate 201, a CoFeB layer on the Ta layer, and a seed layer such as $Mn_xN$ (e.g. where 2 or 2.5≤x≤4 or 4.75) used for templating structure 210A.

Nonmagnetic spacer layer 240 separates free layer 230 from reference layer 250. In some embodiments, nonmagnetic spacer layer is a tunneling barrier layer, such as crystalline MgO. In some embodiments, nonmagnetic spacer layer 240 may be a conductive or other layer. A magnetoresistance depending upon the relative orientations of magnetic moments 232 and 252 is developed across nonmagnetic spacer layer 240. For example, for magnetic junction 200A being an MTJ, a tunneling magnetoresistance across tunneling barrier layer 240 is high if magnetic moments 232 and 252 are antiparallel and low if magnetic moments 232 and 252 are parallel (this describes the case where both magnetic layers have positive spin polarization).

Reference layer magnetic moment 252 may be fixed by the magnetic properties of reference layer 250. In the embodiment shown, for example, reference layer 250 has a stable magnetic moment 252 perpendicular-to-plane. In other embodiments, an optional pinning layer (not shown) may be used to fix the magnetization (not shown) of reference layer 250. The optional pinning layer may be an AFM layer or multilayer that pins the magnetic moment 252 of reference layer 250 by an exchange-bias interaction. Although shown as a simple layer, reference layer 250 may be a synthetic layer. Reference layer 250 may thus contain or consist of a synthetic antiferromagnetic or synthetic ferrimagnetic structure. For example, reference layer 250 may include multiple magnetic layers separated by and antiferromagnetically coupled through nonmagnetic layer(s). For example, reference layer 250 may include two magnetic layers antiferromagnetically coupled through a nonmagnetic layer via the Ruderman-Kittel-Kasuya-Yosida (RKKY) interaction. Other multilayered structures can be used in or for reference layer 250. For example, reference layer 250 may be or include a multilayered structure including or composed of a combination of ferromagnetic metals (e.g. CoFeB, Fe, Co, and/or CoFe), refractory metals (e.g. Ta, Mo, and/or W), exchange coupling metals (e.g. Ir, Ru, Rh, and/or Cr) and/or Co-based hard magnets (e.g. CoPt, Co/Pt, CoNi, Co/Ni, CoPd, Co/Pd). Reference layer 250 may contain synthetic antiferromagnetic or synthetic ferrimagnetic structure.

Reference layer 250 may also include one or more Heusler compounds. For example, reference layer 250 may be a multilayered structure including or composed of any one or more of perpendicularly magnetized Heusler alloys (e.g. $Mn_3Ge$, $Mn_3Al$, $Mn_3Sb$, $Mn_3Ga$, $Mn_3Sn$, $Mn_3In$, $Mn_2CoSn$), $L1_0$ ordered alloys (e.g. FePt, FePd, MnAl, MnSb, MnGa, MnSn, MnGe), and exchange coupling metals (Ir, Ru, Rh, Cr, RuAl, IrAl). In such a case, Reference layer may use a seed layer. For example, the seed layer may include or consist of one of more of Ta, Ru, Fe, Ir, CoFeB, MgO, Ta—N, Ti—N, Mn—N, VN, Cu—N, ScN, IrAl, CoGe, CoSn, NiAl, FeAl, CoAl, RuAl, Cr, and Cr—Ru.

Free layer 230, resistive insertion layer 220 and templating structure 210A are analogous to magnetic layer 130, resistive insertion layer 120 and templating structure 110A, respectively, of magnetic structure 100A. Free layer 230 includes a Heusler compound having a high PMA. In some embodiments, free layer 230 includes only Heusler compound(s). Thus, the structure, composition, and properties of templating structure 210A, resistive insertion layer 220 and free layer 230 are analogous to those of templating structure 110A, resistive insertion layer 120, and magnetic layer 130, respectively.

Although it is a resistive layer, the total resistance of resistive insertion layer 220 is desired to have a small effect on operation of magnetic junction 200A. Thus, the resistance of resistive insertion layer 220 is desired to be relatively small in comparison to tunneling barrier layer 240. For example, the resistance of resistive insertion layer 220 may be not more than ten percent of the tunneling barrier resistance. In some embodiments, the resistance of resistive insertion layer 220 may be not more than five percent of the resistance of tunneling barrier layer 240. In some such embodiments, the resistance of resistive insertion layer 220 may be not more than two percent of the tunneling barrier resistance. The resistance area product of resistive insertion layer 220 is thus smaller than the resistance area product of tunneling barrier layer 240. Consequently, the parasitic resistance due to resistive insertion layer 220 may be reduced.

The presence of resistive insertion layer 220 may reduce magnetic damping for magnetic junction 200A. Insertion layer 220 may reduce the movement of electrons between free layer 230 and templating structure 210A. To program magnetic junction 200A using STT, a spin polarized current is driven through free layer 230. For example, for a current driven from substrate 201 to capping layer 260, electrons travel through reference layer 250 and become spin polarized in the direction of magnetic moment 252. Electrons in the spin polarized current transfer their angular moment to free layer 230. The relatively higher resistance of resistive insertion layer 220 reduced or precludes the movement of electrons from free layer 230 to templating structure 210A. Thus, magnetic damping may be reduced. Free layer 230 may be written using a smaller magnitude write current and/or a shorter current pulse width. Thus, performance of a magnetic junction 200A may be improved.

FIG. 2B depicts magnetic junction 200B residing on substrate 201. Magnetic junction 200B includes resistive insertion layer 220, free layer 230, nonmagnetic spacer layer 240, reference layer 250, and capping layer 260 that are analogous to resistive insertion layer 220, free layer 230, nonmagnetic spacer layer 240 reference layer 250, and capping layer 260 depicted in FIG. 2A, respectively. Further, resistive insertion layer 220, templating structure 210B and free layer 230 are analogous to resistive insertion layer 120, templating structure 110B and magnetic layer 130, respectively, of magnetic structure 100B. For example, free layer 230 includes or is composed of Heusler compound(s) such as those in magnetic layer 130. Similarly, templating structure 210B may be thin (e.g. not more than twenty Angstroms thick in some embodiments) and include any one or more of B2 binary alloys such as CoAl, CoGa, CoGe, CoSn, NiAl, FeAl, IrAl, RuAl, CuZn, and AgZn and/or other cubic-based ordered alloys (e.g. Ag—Mg) having a small (e.g. not more than ten percent and not more than five percent in some embodiments) in-plane lattice mismatch with the Heusler compound of free layer 230. Resistive insertion layer 220 is configured to reduce magnetic damping for the Heusler compound and allow for templating of the Heusler compound and templating structure 110. Further, the resistance of resistive insertion layer 220 is sufficiently low that the parasitic resistance due to resistive insertion layer 220 may not adversely affect operation of magnetic junction 200B. Optional seed layer 204 is used in templating insertion layer 220. Optional seed layer 204 may include one or more of Ta, Ru, Fe, Ir, CoFeB, MgO, Ta—N, Ti—N, Mn—N, VN, Cu—N, Sc—N, CoSn, CoGe, NiAl, FeAl, CoAl, RuAl, IrAl, Cr, and Cr—Ru.

The presence of resistive insertion layer 220 may reduce magnetic damping for magnetic junction 200B. Insertion layer 220 may reduce the movement of electrons from free layer 230 and templating structure 210B to seed layer 204 and other layers. Thus, magnetic damping may be reduced. Free layer 230 may be written using a smaller magnitude write current and/or a shorter current pulse width. Thus, performance of a magnetic junction 200B may be improved.

FIG. 2C depicts magnetic junction 200C residing on substrate 201. Magnetic junction 200C includes resistive insertion layer 220, free layer 230, nonmagnetic spacer layer 240, reference layer 250, and capping layer 260 that are analogous to resistive insertion layer 220, free layer 230, nonmagnetic spacer layer 240 reference layer 250, and capping layer 260 depicted in FIG. 2A, respectively. Free layer 230, resistive insertion layer 220 and templating structure 210C are analogous to magnetic layer 130, resistive insertion layer 120 and templating structure 100B. Resistive insertion layer 220, templating structure 210C and free layer 230 are analogous to resistive insertion layer 220, templating structure 210B and magnetic layer 230.

Magnetic junction 200C also includes additional templating structure 270. Additional templating structure 270 is analogous to templating structure 210C. Thus, additional templating structure 270 may include any one or more of B2 binary alloys such as CoAl, CoGa, CoGe, CoSn, NiAl, FeAl, IrAl, RuAl, CuZn, and AgZn and/or other cubic-based ordered alloys (e.g. Ag—Mg) having a small (e.g. not more than ten percent and not more than five percent in some embodiments) in-plane lattice mismatch with the Heusler compound of free layer 230.

Resistive insertion layer 220 may reduce magnetic damping for magnetic junction 200C. Insertion layer 220 may reduce the movement of electrons from free layer 230 and templating structure 210C to seed layer 204 and other layers. Thus, magnetic damping may be reduced. Free layer 230 may be written using a smaller magnitude write current and/or a shorter current pulse width. Thus, performance of a magnetic junction 200C may be improved.

Figure 3A:
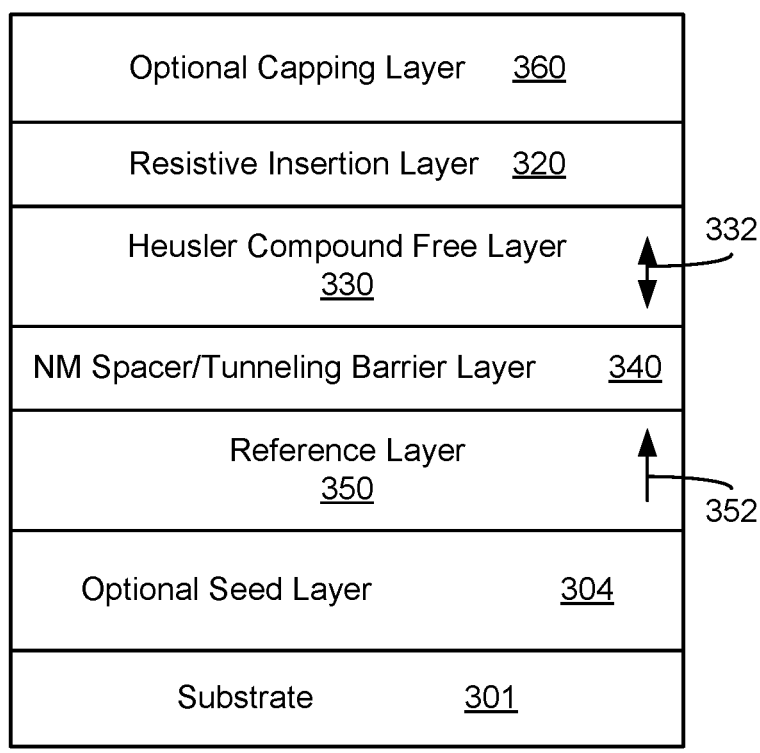
FIGS. 3A-3B depict embodiments of magnetic junctions including Heusler compounds and having reduced magnetic damping.
Figure 3B:
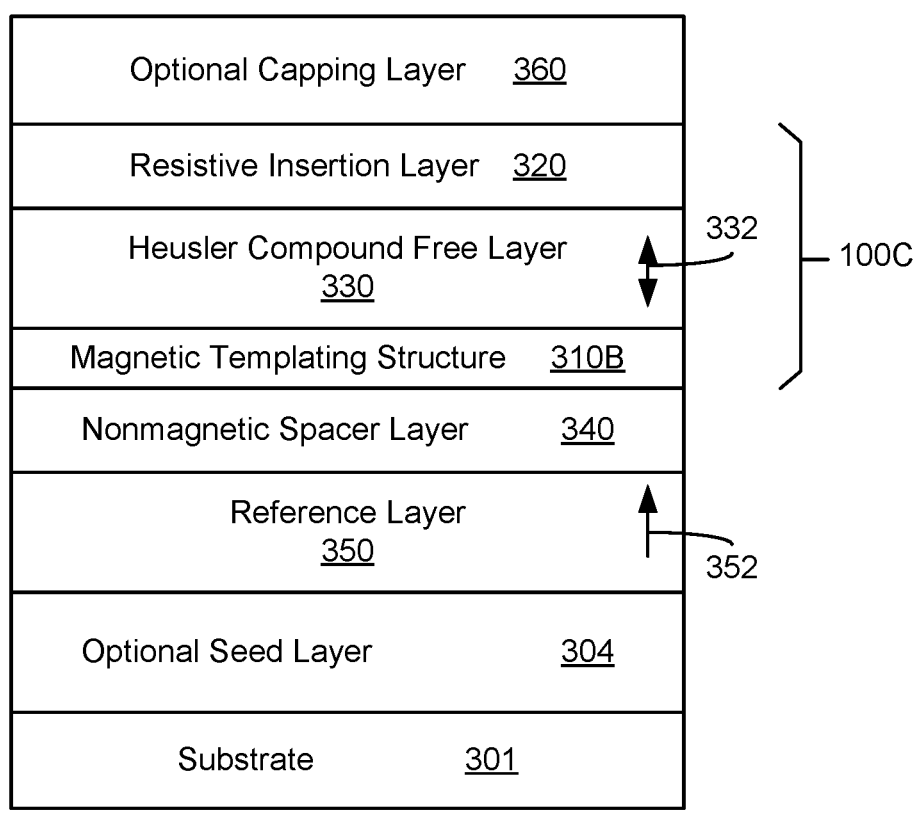

FIGS. 3A-3B depict embodiments of magnetic devices 300A and 300B including Heusler compounds and having reduced magnetic damping. For clarity, FIGS. 3A-3B are not to scale. In the embodiments shown, magnetic devices 300A and 300B are top free layer magnetic junctions. Thus, the free layer is further from the substrate than the reference layer in such magnetic junctions. Magnetic devices 300A and/or 300B may be used in a variety of electronic devices, such as MRAMs. Although particular layers are shown, other and/or different structures may be included.

FIG. 3A depicts magnetic junction 300A residing on substrate 301. Magnetic junction 300A includes resistive insertion layer 320, free layer 330, nonmagnetic spacer layer 340, and reference layer 350. Reference layer 350 and free layer 330 are magnetic, having magnetic moments 352 and 332, respectively. In the embodiment shown, each of free layer 330 and reference layer 350 have a PMA anisotropy energy that exceeds the out-of-plane demagnetization energy. Consequently, magnetic moments 332 and 352 are shown as perpendicular to plane. Magnetic moment 332 of free layer 330 may be programmed to be in one of multiple stable states. Magnetic moment 332 is shown as dual headed arrow. Magnetic moment 352 of reference layer 350 is stable in the embodiment shown. Consequently, magnetic moment 352 is shown as a single arrow. Although shown in a particular direction (toward the top of the page), magnetic moment 352 may be stable in another direction (e.g. toward the bottom of the page). Magnetic junction 300A may also include optional polarization enhancement layer(s) (PEL(s)) having a high spin polarization. For example, a PEL might include Fe, CoFe and/or CoFeB. The PEL may be between reference layer 350 and nonmagnetic spacer layer 340 and/or between nonmagnetic spacer layer 340 and free layer 330. Also shown are optional seed layer(s) 304 and optional capping layer(s) 360. Optional capping layer 360 is analogous to optional capping layer 260. Optional seed layer 304 is appropriate for forming reference layer 350. For example, reference layer 350 may be a multilayered structure including or composed of a combination of ferromagnetic metals (e.g. CoFeB, Fe, Co, and/or CoFe), refractory metals (e.g. Ta, Mo, and/or W), exchange coupling metals (e.g. Ir, Ru, Rh, and/or Cr) and/or Co-based hard magnets (e.g. CoPt, Co/Pt, CoNi, Co/Ni, CoPd, Co/Pd). In some embodiments, reference layer 350 may contain synthetic antiferromagnetic or synthetic ferrimagnetic structure. In such a case, seed layer 304 may include or be composed of any one or more of a combination of Ta, Ru, Ir, Pt, CoFeB, and metallic nitrides (e.g. Ta—N, Ti—N, Mo—N, Cu—N and the like). In some such magnetic junctions, an additional nonmagnetic spacer layer and an additional reference layer may be interposed between free layer 330 and capping layer 360. Thus, dual magnetic junctions may be formed.

Free layer 330 and resistive insertion layer 320 are analogous to magnetic layer 130 and resistive insertion layer 120 of magnetic structure 100C. However, a structure analogous to templating structure 110C has been omitted. Magnetic junction 300A thus has no templating structure for free layer 330. The presence of resistive insertion layer 320 may reduce magnetic damping for magnetic junction 300A in a manner analogous to that described above.

Resistive insertion layer 320 may reduce the unwanted movement of electrons. To program magnetic junction 300A using STT, a spin polarized current is driven through free layer 330. Electrons in the spin polarized current transfer their angular moment to free layer 330. The relatively higher resistance of resistive insertion layer 320 reduced or precludes the movement of electrons from free layer 330. Thus, magnetic damping may be reduced. Free layer 330 may be written using a smaller magnitude write current and/or a shorter current pulse width. Thus, performance of a magnetic junction 300A may be improved.

FIG. 3B includes magnetic junction 300B that is analogous to magnetic junction 300A. Magnetic junction 300B includes resistive insertion layer 320, free layer 330, nonmagnetic spacer layer 340, and reference layer 350 analogous to those used for magnetic junction 300B. However, magnetic junction 300B includes a templating structure 310B. Further, templating structure 310B may be magnetic. Free layer 330, templating structure 310 and resistive insertion layer 320 are analogous to magnetic layer 130, templating structure 110C and resistive insertion layer 120. Thus, the structure, composition and performance of layers 330, 320 and 310B are analogous to layers 130, 120, and 110C, respectively. For example, templating structure 310B may be thin, magnetic and include $Co_{(1-x)}Al_x$, where x is less than 0.4.

The presence of resistive insertion layer 320 may reduce magnetic damping for magnetic junction 300A. Insertion layer 320 may reduce the unwanted movement of electrons. Thus, magnetic damping may be reduced. Free layer 330 may be written using a smaller magnitude write current and/or a shorter current pulse width. Thus, performance of a magnetic junction 300B may be improved.

Figure 4:
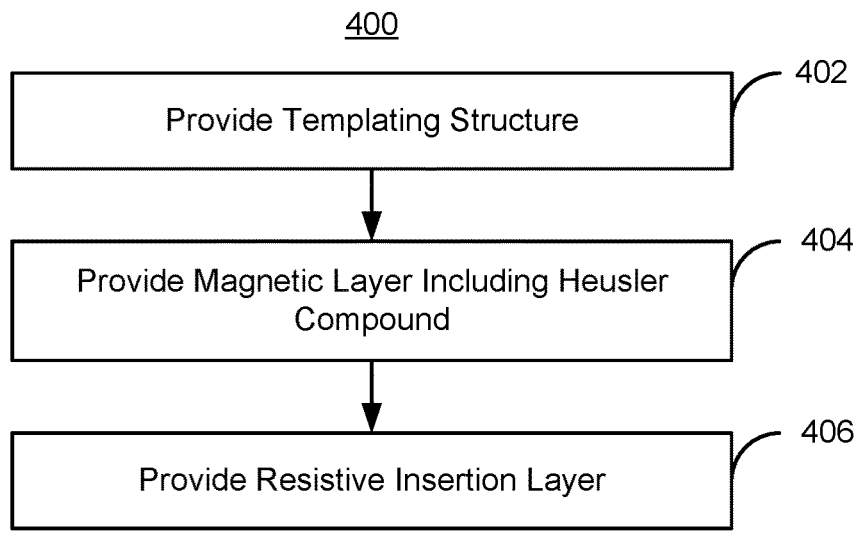
FIG. 4 is a flow chart depicting an embodiment of a method for providing a magnetic structure including a Heusler compound and having reduced magnetic damping.

FIG. 4 is a flow chart depicting an embodiment of method 400 for fabricating magnetic structure. For simplicity, some steps may be omitted, performed in another order, include substeps and/or combined. Although described in the context of single components, multiple components may be fabricated. For example, multiple magnetic structures may be fabricated. Further, the method 400 may start after other steps in forming a magnetic device including the magnetic structure have been performed. For simplicity, the method 400 is described in the context of the magnetic structures 100A, 100B and 100C. However, other magnetic structures may be formed.

A templating structure is provided, at 402. For magnetic structures 100A and 100C, providing the templating structure is performed prior to formation of the magnetic and resistive insertion layers. For magnetic structure 100B, resistive insertion layer 120 is provided first. The templating structure formed at 402 is appropriate for the magnetic structure being fabricated. In some embodiments, 402 includes depositing or growing one or more layers of the templating structure. The layers may be deposited at a particular temperature range. For example, the templating structure may be deposited at a specific temperature or at a specific range of temperature. In some embodiments, the templating structure is provided within a range of temperatures including temperature(s) of not less than 70K and not more than 700K. Deposition methods may include but are not limited to PVD sputtering, pulse lased deposition, atomic layer deposition, ion-beam deposition, plasma enhanced chemical vapor deposition and/or other deposition mechanism(s). The fabrication of a layer may include annealing the layer. In-situ annealing (e.g. in vacuum or in any specific gas environment) may be performed right after deposition of any layer shown in each embodiment. Annealing may also occur later in fabrication (e.g. while the surface of the layer is exposed or after deposition of other layer(s)). The range of temperatures for in-situ annealing includes but may not be limited to at least 350K through not more than 700K.

A magnetic layer including one or more Heusler compounds is provided, at 404. In some embodiments, such as when method 400 is used to form magnetic structure 100C, 404 is performed before formation of the resistive insertion layer. In other embodiments, such as for fabricating magnetic structure 100A or 100B, 404 is performed after 402 and formation of the resistive insertion layer. In some embodiments, 404 may be performed using the same techniques, temperature ranges and processes as described for 402.

A resistive insertion layer is provided, at 406. In some embodiments, such as for fabricating magnetic structure 100B, 406 is performed before formation of the templating structure and the magnetic layer including Heusler compound(s). In other embodiments, such as for fabricating magnetic structure 100A or 100C, 406 is performed later. If magnetic structure 100C is formed, 406 may include fabricating an amorphous resistive insertion layer. In some embodiments, 406 may be performed using the same techniques, temperature ranges and processes as described for 402.

Thus, using method 400, magnetic structures 100A, 100B, and/or 100C may be formed. Thus, the benefits described herein may be achieved. In particular, a high PMA (e.g. stable magnetic moment perpendicular to plane), high TMR may be achieved with reduced magnetic damping.

Figure 5:
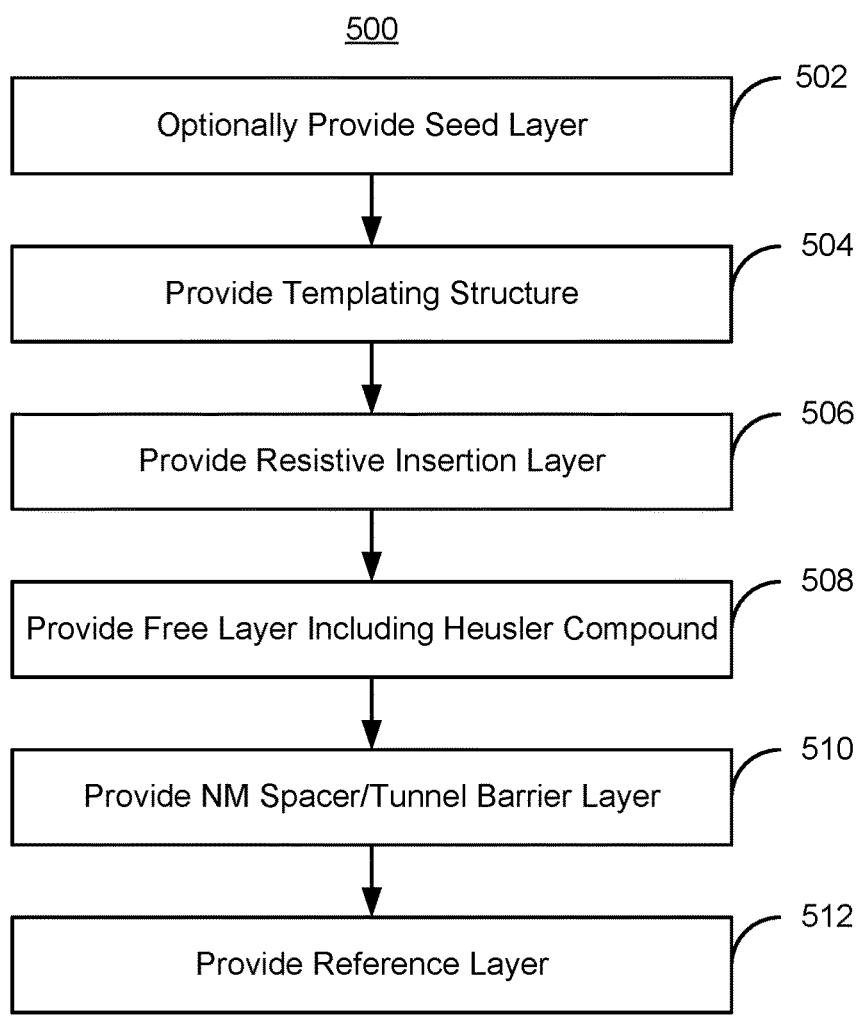
FIG. 5 if a flow chart depicting an embodiment of a method for providing a magnetic device including a Heusler compound and having reduced magnetic damping.

FIG. 5 is a flow chart depicting an embodiment of method 500 for fabricating magnetic device, such as magnetic junctions written using spin transfer torque and including a magnetic structure. For simplicity, some steps may be omitted, performed in another order, include substeps and/or combined. Although described in the context of single components, multiple components may be fabricated. For example, multiple magnetic junctions may be formed. Further, the method 500 may start after other steps in forming a magnetic device have been performed.

A seed layer may optionally be provided, at 502. In some embodiments, 502 provides the appropriate seed for the particular embodiment being fabricated. For example, in some embodiments, 502 includes providing a $Mn_xN$ seed layer. 502 may also include fabricating an additional templating layer, such as templating structure 270 of magnetic device 200B.

A templating structure is provided, at 504. In some embodiments, 504 is analogous to 402. The layers may be deposited at a particular temperature range. For example, the templating structure may be deposited at a specific temperature or at a specific range of temperature. In some embodiments, the templating structure is provided within a range of temperatures including temperature(s) of not less than 70K and not more than 700K. Deposition methods may include but are not limited to PVD sputtering, pulse lased deposition, atomic layer deposition, ion-beam deposition, plasma enhanced chemical vapor deposition and/or other deposition mechanism(s). The fabrication of a layer may include annealing the layer. In-situ annealing (e.g. in vacuum or in any specific gas environment) may be performed right after deposition of any layer shown in each embodiment. Annealing may also occur later in fabrication (e.g. while the surface of the layer is exposed or after deposition of other layer(s)). The range of temperatures for in-situ annealing includes but may not be limited to at least 350K through not more than 700K.

A resistive insertion layer is provided, at 506. In some embodiments, 506 is analogous to 406. In some embodiments, such as for fabricating magnetic junction 200B, 506 is performed before formation of the templating structure and the magnetic layer including Heusler compound(s). In other embodiments, such as for fabricating magnetic junctions 200A or 300C, 506 is performed later. In some embodiments, 506 may be performed using the same techniques, temperature ranges and processes as described for 406.

A free layer including one or more Heusler compounds is provided, at 508. In some embodiments 508 is analogous to 404. A nonmagnetic spacer layer, such as a tunneling barrier layer, and a reference layer are provided, at 510 and 512, respectively.

Thus, using method 500, magnetic devices 200A, 200B, 200C, 300A and/or 300B may be formed. Thus, the benefits described herein may be achieved. In particular, a high PMA (e.g. stable magnetic moment perpendicular to plane), high TMR may be achieved with reduced magnetic damping.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A magnetic structure, comprising:
    a magnetic layer including a Heusler compound, the magnetic layer having a perpendicular magnetic anisotropy energy exceeding an out-of-plane demagnetization energy;
    a resistive insertion layer configured to reduce magnetic damping for the Heusler compound and allow for tem plating of the Heusler compound, wherein the resistive insertion layer is crystalline; and
    a templating structure having a crystal structure configured to template at least one of the Heusler compound and the resistive insertion layer, the magnetic layer residing on the templating structure,
    wherein the resistive insertion layer is on the magnetic layer such that the magnetic layer is between the templating structure and the resistive insertion layer, and
    wherein the templating structure is magnetic.

2. The magnetic structure of claim 1, wherein the magnetic structure further includes:
    a tunneling barrier layer, the templating structure residing on top of the tunneling barrier layer; and wherein the templating structure has the thickness of not more than twenty Angstroms.

3. The magnetic structure of claim 2, wherein the templating structure includes $Co_{(1-x)}Al_x$, where x is less than 0.4 and the thickness is not more than ten Angstroms.

4. A magnetic device, comprising:
    a free layer including a Heusler compound, the free layer having a perpendicular magnetic anisotropy energy exceeding an out-of-plane demagnetization energy;
    a resistive insertion layer configured to reduce magnetic damping for the Heusler compound and allow for tem plating of the Heusler compound, wherein the resistive insertion layer is crystalline;
    a templating structure having a crystal structure configured to template at least one of the Heusler compound and the resistive insertion layer, the free layer residing on the templating structure;
    a nonmagnetic spacer layer; and
    a reference layer, the nonmagnetic spacer layer being between the free layer and the reference layer,
    wherein the resistive insertion layer is on top of the templating structure and between the templating structure and the free layer, and
    wherein the resistive insertion layer has a lattice mismatch of not more than ten percent for the Heusler compound.

5. The magnetic device of claim 4, wherein the nonmagnetic spacer layer has a nonmagnetic spacer layer resistance;
    wherein the resistive insertion layer has a (001) texture, and a resistance of not more than ten percent of the nonmagnetic spacer layer resistance; and
    wherein the Heusler compound has a Heusler thickness of at least five nanometers.

6. The magnetic device of claim 4, wherein the Heusler compound includes at least one of $Mn_3Ge$, $Mn_3Al$, $Mn_3Sb$, $Mn_3Ga$, $Mn_3Sn$, $Mn_3In$, and $Mn_2CoSn$;
    wherein the resistive insertion layer includes at least one of MgO, Mg—Al-Oxide, Mg—Ti-Oxide, Mg—Fe-Oxide, Mg—Zn-Oxide, Mg—Mn-Oxide, $MgAl_2O_4$, $CaTiO_3$, $SrTiO_3$, $BaTiO_3$, $LaAlO_3$, $BaSnO_3$, NaCl, LiF, GaAs, ZnSe, $Cu(In_xGa_{1-x})Se_2$, AlN and ScN; and
    wherein the tem plating structure includes at least one of Ta, Ru, Fe, Ir, CoFeB, MgO, Ta—N, Ti—N, Mn—N, VN, Cu—N, Sc—N, CoSn, CoGa, CoGe, NiAl, FeAl, CoAl, RuAl, IrAl, CuZn, AgZn, Cr, Ag—Mg, and Cr—Ru.

7. A method for providing a magnetic structure, comprising:
    providing a tem plating structure having a crystal structure configured to template at least one of a Heusler compound and a resistive insertion layer;
    providing the resistive insertion layer configured to reduce magnetic damping for the Heusler compound and allow for templating of the Heusler compound wherein the resistive insertion layer is crystalline; and
    providing, on the templating structure, a magnetic layer including the Heusler compound, the magnetic layer having a perpendicular magnetic anisotropy energy exceeding an out-of-plane demagnetization energy,
    wherein the templating structure is between the resistive insertion layer and the magnetic layer, and
    wherein the resistive insertion layer includes at least one of Mg—Fe-Oxide, Mg—Zn-Oxide, Mg—Mn-Oxide, $CaTiO_3$, $SrTiO_3$, $BaTiO_3$, $LaAlO_3$, $BaSnO_3$, NaCl, LiF, GaAs, ZnSe, $Cu(In_xGa_{1-x})Se_2$, AlN and ScN.

8. The method of claim 7, wherein
    the resistive insertion layer has a lattice mismatch of not more than ten percent of the Heusler compound and the templating structure has a thickness of not more than twenty Angstroms.

9. The method of claim 7, wherein the templating structure has the thickness of at least one Angstrom and not more than ten Angstroms.

10. The method of claim 7, further comprising:
    providing an additional tem plating structure below the resistive insertion layer, the resistive insertion layer being between the templating structure and the additional templating structure.

11. The method of claim 10, further comprising:
    providing a seed layer, the additional templating structure residing on and sharing an interface with the seed layer.

* * * * *